United States Patent
Auger et al.

(10) Patent No.: US 10,462,895 B2
(45) Date of Patent: Oct. 29, 2019

(54) ELECTROMAGNETIC SHIELD FOR AN ELECTRONIC DEVICE

(71) Applicant: HARMAN INTERNATIONAL INDUSTRIES, INC., Stamford, CT (US)

(72) Inventors: Elijah Auger, Fenton, MI (US); Sabin Oana, Howell, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 15/091,251

(22) Filed: Apr. 5, 2016

(65) Prior Publication Data

US 2017/0290140 A1  Oct. 5, 2017

(51) Int. Cl.
| | |
|---|---|
| H05K 1/02 | (2006.01) |
| H05K 1/11 | (2006.01) |
| H05K 7/14 | (2006.01) |
| H05K 9/00 | (2006.01) |
| H01Q 1/50 | (2006.01) |

(52) U.S. Cl.
CPC ............. *H05K 1/0216* (2013.01); *H01Q 1/50* (2013.01); *H05K 1/111* (2013.01); *H05K 1/115* (2013.01); *H05K 7/142* (2013.01); *H05K 9/0033* (2013.01); *H05K 9/0039* (2013.01); *H05K 2201/0707* (2013.01); *H05K 2201/10098* (2013.01)

(58) Field of Classification Search
CPC .... H05K 1/115; H05K 9/0039; H05K 9/0033; H05K 7/142; H01Q 1/50
See application file for complete search history.

(56) References Cited

U.S. PATENT DOCUMENTS

| | | | | |
|---|---|---|---|---|
| 4,831,498 A | | 5/1989 | Baba | |
| 5,107,404 A | * | 4/1992 | Tam | ........................ H04B 1/38 361/736 |
| 5,170,321 A | * | 12/1992 | Oslund | ................ H05K 9/0022 174/357 |
| 6,043,983 A | * | 3/2000 | Taylor | ................... H05K 9/0033 174/351 |

(Continued)

FOREIGN PATENT DOCUMENTS

| | | | | |
|---|---|---|---|---|
| JP | 2012005244 A | * | 1/2012 | ........... H05K 5/0047 |
| WO | WO-2014069644 A1 | * | 5/2014 | ........... H05K 5/0047 |

OTHER PUBLICATIONS

European Search Report for Application No. EP 17159483; dated Aug. 24, 2017; 7 pages, and European Search Opinion.

*Primary Examiner* — Nathan Milakovich
(74) *Attorney, Agent, or Firm* — Brooks Kushman P.C.

(57) ABSTRACT

An electronic device including a substrate having opposing top and bottom surfaces is provided. A ground layer is disposed in the substrate. An electrically conductive chassis has a mounting surface to receive the bottom surface of the substrate and is in electrical contact with the ground layer by a ground stitch via. An electromagnetic shield is defined by the ground layer, the ground stitch via and the chassis to enclose the bottom surface of the substrate and protect the bottom surface from electromagnetic interference. A non-conductive cover is assembled to the substrate in tension so that an interior surface of the cover applies a force to the top surface of the substrate thereby ensuring the chassis maintains electrical contact with the ground layer.

19 Claims, 4 Drawing Sheets

(56) References Cited

U.S. PATENT DOCUMENTS

| | | | | |
|---|---|---|---|---|
| 6,058,000 A * | 5/2000 | Koenck | ................ | G06F 1/1626 |
| | | | | 361/113 |
| 6,980,439 B2 * | 12/2005 | Schultz | ................ | H01L 23/552 |
| | | | | 174/558 |
| 6,995,314 B2 * | 2/2006 | Gottwald | ................ | G01S 7/032 |
| | | | | 174/359 |
| 7,443,693 B2 * | 10/2008 | Arnold | ................ | H01L 23/04 |
| | | | | 361/800 |
| 2015/0009642 A1 * | 1/2015 | Caclard | ................ | H05K 5/0047 |
| | | | | 361/753 |
| 2015/0029682 A1 * | 1/2015 | Kadoya | ................ | H05K 9/0039 |
| | | | | 361/748 |

\* cited by examiner

ELECTROMAGNETIC SHIELD FOR AN ELECTRONIC DEVICE

TECHNICAL FIELD

The present disclosure generally relates to shielding devices for minimizing electromagnetic interference and susceptibility effects on electrical and electronic devices. More particularly, the present disclosure relates to a shielding device for a printed circuit board assembly having a transmission and/or receiver component and an enclosure.

BACKGROUND

Electronic devices such as audio devices and infotainment systems, and other devices often contain circuitry and components that are susceptible to electromagnetic interference and require electromagnetic shielding. Generally, parasitic radiation is generated from electrical components or circuits during operation which may influence the electrical performance of other electrical components. Therefore, it is important to shield the electronic devices against electromagnetic interference.

It can be costly to provide an electromagnetic shield to keep interfering noise out of a selected region of a device where it can cause harm to sensitive electrical components. To protect from electromagnetic interference, electronic circuits and electric components mounted on a printed circuit board are typically enclosed within metal enclosures that shield from electromagnetic radiation. In addition to being costly, conventional electromagnetic shield covers mounted to a printed circuit board can be undesirably bulky and time consuming to install.

In some situations, the electronic device may include a component through which electromagnetic signals will be passed, such as for an antenna, transmitter, receiver, or transceiver. Providing an electromagnetic shield to printed circuit boards including an antenna, for example, may increase the complexity and cost of an electromagnetic shield because it must protect against parasitic electromagnetic radiation in one area of the printed circuit board while allowing transmission of electromagnetic radiation in another area.

SUMMARY

In one embodiment, an electronic device is provided with a substrate having opposing top and bottom surfaces. A plurality of conductive pads and at least one first electrical component are mounted on the bottom surface of the substrate. A second electrical component is disposed in the substrate adjacent the top surface. A ground layer is disposed in the substrate between the second electric component and the bottom surface. A plurality of ground stitch vias are provided where via electrically connects the ground layer and one of the conductive pads. A metallic chassis has a mounting surface to receive the bottom surface of the substrate. The mounting surface includes a plurality of raised dimples that each contact one of the plurality of conductive pads. A plastic cover receives the top surface of the substrate and has a plurality of posts that contact the top surface of the substrate opposite the dimples. A fastener extends through the plastic cover and substrate into the chassis so that the posts engage the top surface of the substrate thereby ensuring electric contact between each of the pads and dimples along the bottom surface. A Faraday cage is a formed with the ground layer, the via and the chassis to enclose the bottom surface of the substrate and the first electrical component mounted thereto. The Faraday cage thereby defines a shielded enclosure that protects the first electrical component from electromagnetic interference.

In another embodiment, the second electrical component is a transmission component whereby electromagnetic signals from the transmission component are not prevented by the Faraday cage.

In a further embodiment, the second electrical component is an antenna.

In another embodiment, a pair of fasteners is disposed at opposing sides of the substrate and defines a span there between. The posts of the plastic cover contact the substrate to produce a downward force and maintain the plastic cover in tension along the span between the pair of fasteners.

In yet another embodiment, the plurality of raised dimples and conductive pads are disposed within the span between the pair of fasteners. Maintaining the plastic cover in tension ensures contact between each of the conductive pads and raised dimples in any environmental conditions.

In still another embodiment, the conductive pads are spaced apart by a maximum distance based on an electromagnetic wavelength.

In another embodiment, wherein the chassis is formed as a single metallic component.

In another embodiment, the Faraday cage does not include any additional electromagnetic shield component to form the Faraday cage.

In one other embodiment, an electronic device including a substrate having opposing top and bottom surfaces is provided. A ground layer is disposed in the substrate. An electrically conductive chassis has a mounting surface to receive the bottom surface of the substrate and is in electrical contact with the ground layer by a ground stitch via. An electromagnetic shield is defined by the ground layer, the ground stitch via and the chassis to enclose the bottom surface of the substrate and protect the bottom surface from electromagnetic interference. A non-conductive cover is assembled to the substrate in tension so that an interior surface of the cover applies a force to the top surface of the substrate thereby ensuring the chassis maintains in electrical contact with the ground layer.

In another embodiment, the ground layer is disposed at a predetermined distance from a surface of the chassis.

In still another embodiment, the ground layer is disposed in a layer of the substrate adjacent the top surface.

In another embodiment, the interior surface of the cover includes a plurality of posts arranged along a perimeter, wherein the posts contact the top surface of the substrate.

In yet another embodiment, the electromagnetic shield defines a Faraday cage for preventing electromagnetic interferences, wherein the electromagnetic shield does not include any additional components to form the Faraday cage.

In another embodiment, the cover permits transmission of electromagnetic signals from an electrical component disposed in the substrate outboard of the ground layer.

In one other embodiment, an electronic device is provided with a substrate having opposing top and bottom surfaces. A first electrical component is mounted on the bottom surface of the substrate. A ground layer is disposed in the substrate adjacent the top surface of the substrate. A chassis is formed as a single metallic component and has a mounting surface to receive the bottom surface of the substrate. A Faraday cage is defined by the ground layer and the chassis to enclose the bottom surface of the substrate and the first electrical component mounted thereto thereby protecting the at least one electrical component from electromagnetic interference.

In another embodiment, the mounting surface includes a plurality of raised dimples that each contact one of a plurality of conductive pads disposed on the bottom surface of the substrate. The conductive pads are electrically connected to the ground layer by a via to define the Faraday cage.

In a further embodiment, the mounting surface defines a datum plane, and the ground layer is disposed at a predetermined distance from the datum plane.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
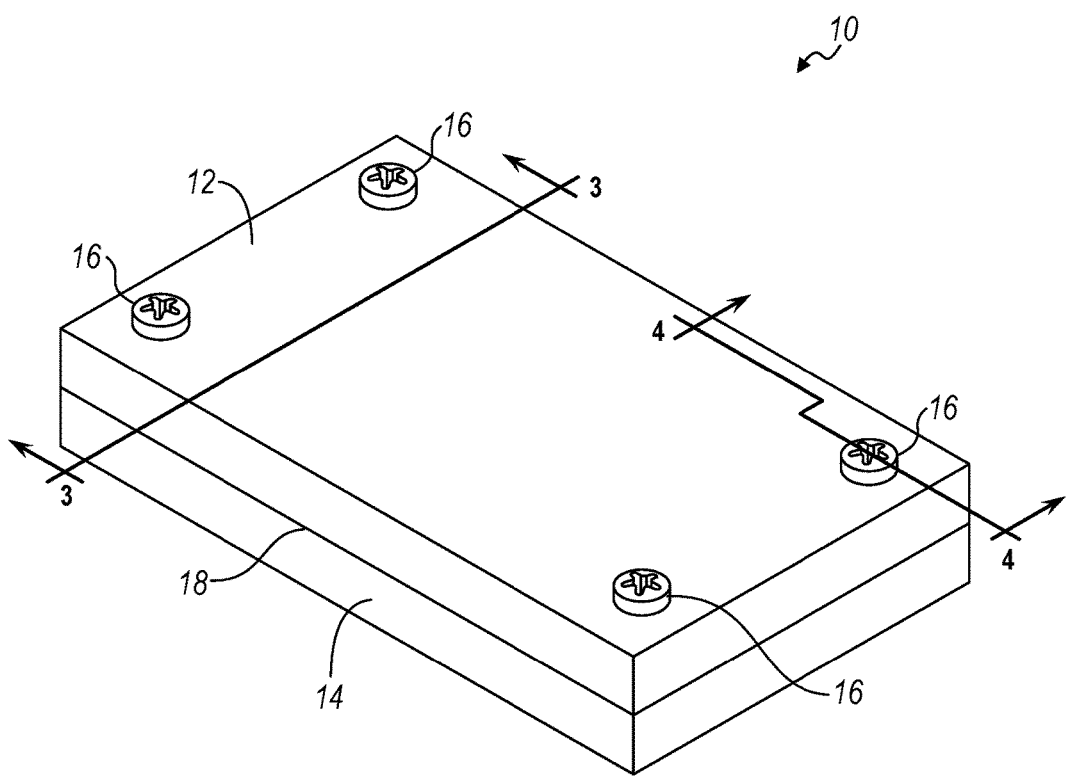
FIG. 1 illustrates an assembled perspective view of an electronic device package with electromagnetic interference shield.

FIG. 1 illustrates a perspective view of an assembled electronic device package 10. The electronic device package 10 includes a top cover 12 and a bottom chassis or frame 14 that encloses an electronic device. The top cover 12 and bottom chassis 14 are joined together with a fastener 16 to form a mechanical enclosure assembly 18.

Figure 2:
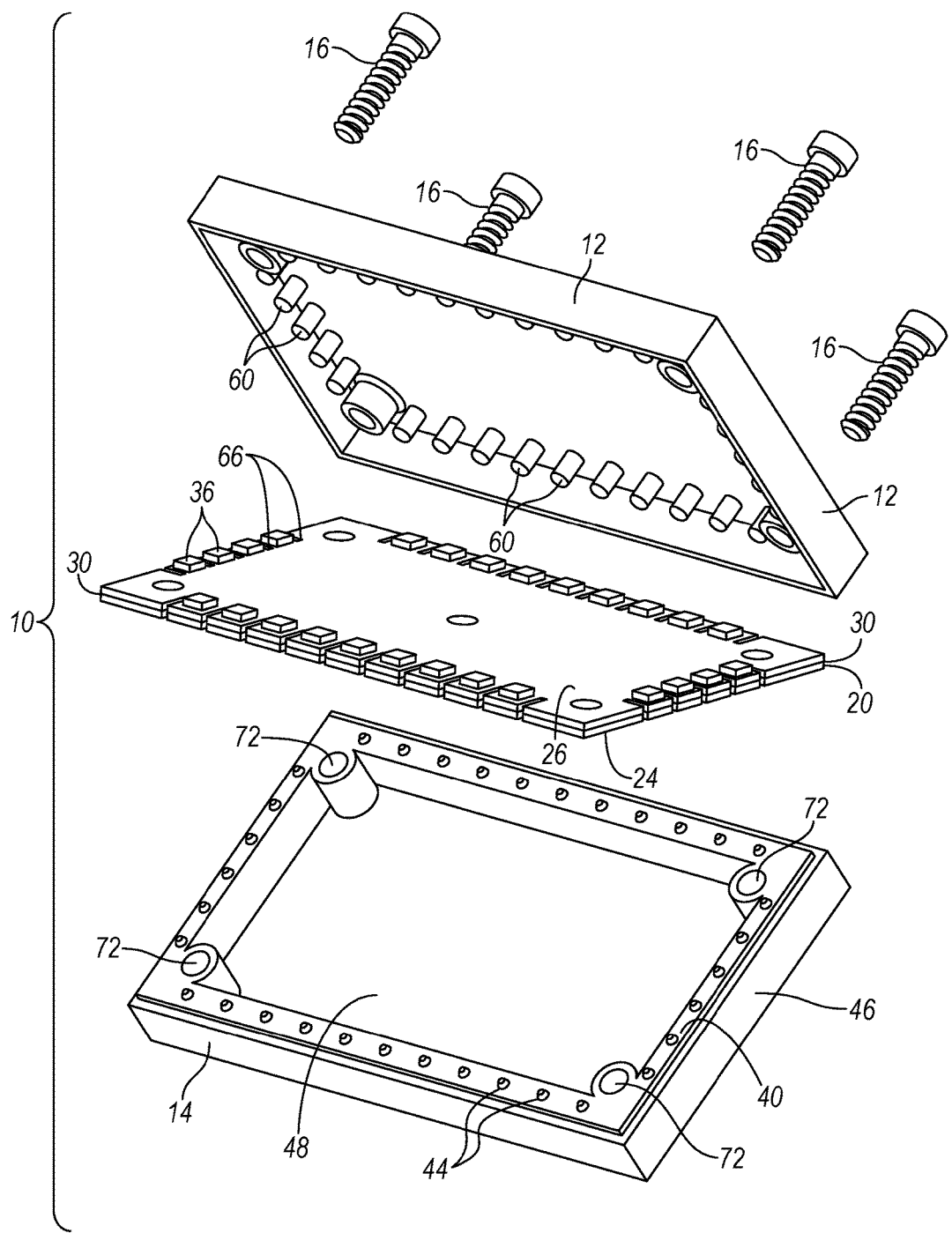
FIG. 2 illustrates an exploded view of the electronic device package of FIG. 1.

FIG. 2 illustrates an exploded view of the electronic device electronic device package 10 that encloses an electronic device being a rigid substrate 20 such a printed circuit board assembly. The electronic device package 10 and substrate 20 may be any suitable shape and are not limited to a generally rectangular shape, as illustrated. As shown, the fasteners 16 are threaded fasteners, such a screws; however, the fasteners 16 may be a suitable fastener for securing the electronic device package 10.

Figure 3:
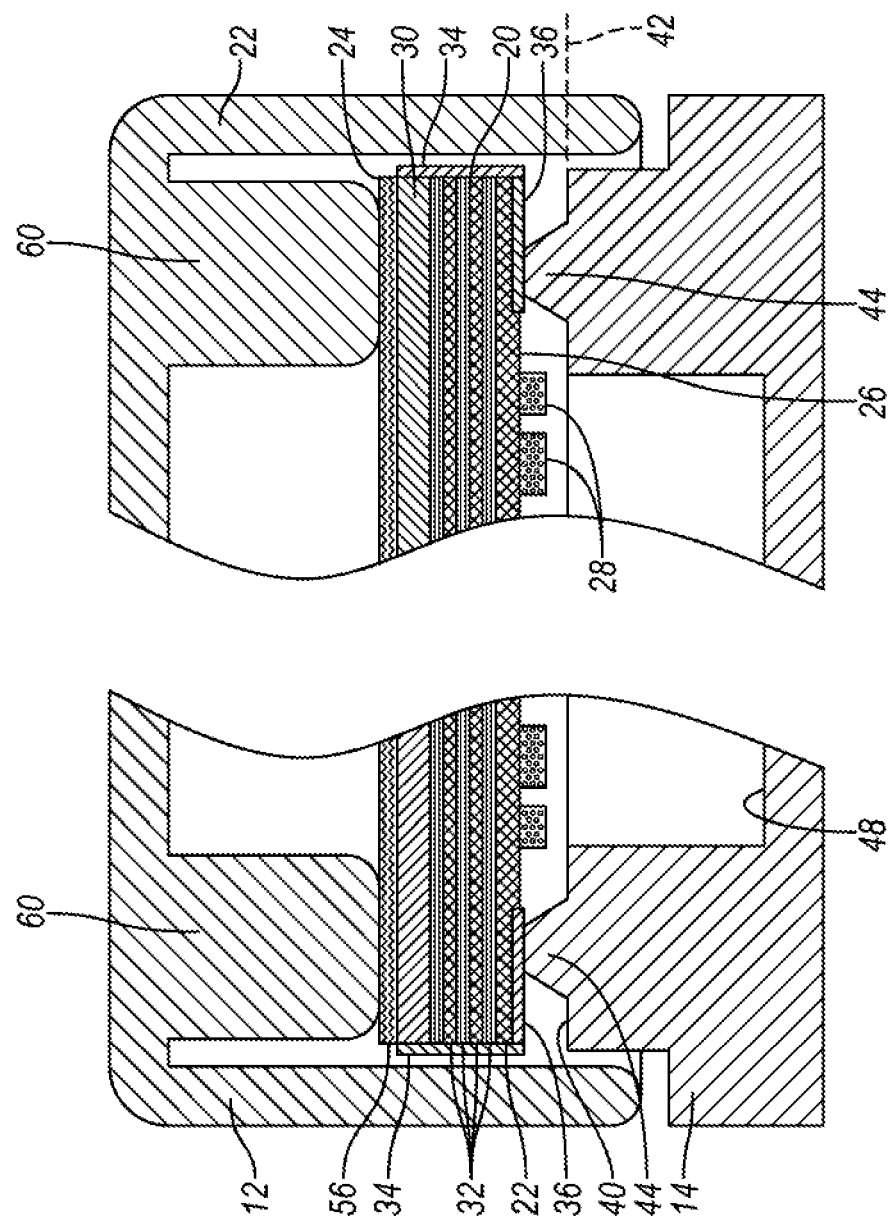
FIG. 3 illustrates a cross-section of the electronic device package of FIG. 1 taken along line 3-3.

FIG. 3 illustrates a cross-section of the assembled electronic device package 10 taken along line 3-3 in FIG. 1. In particular, FIG. 3 illustrates in more detail the substrate 20. The schematic view of the substrate 20 is not necessarily to scale. As shown in more detail in FIG. 3, the substrate 20 has a top surface 24 and an opposing bottom surface 26. The top surface 24 (A side) is defined as the most exterior plane of the substrate 20 while the bottom surface 26 (B side) is defined as the most interior plane of the substrate 20.

Various electrical components 28 may be mounted on a printed circuit board 22 along a top surface 24 of the substrate 20. The printed circuit board 22 may be single sided, as illustrated in FIG. 3, double sided or multi-layer (outer and inner layer) or any configuration known by a person of ordinary skill in the art. The printed circuit board 22 may contain components 28 such as capacitors, resistors or active devices and the like.

The printed circuit board 22 supports and electrically connects the electrical components 28 using conductive traces, or other features etched from copper sheets laminated onto substrate 20 along the bottom surface 26. For example, the electrical components 28 may be surface-mount technology components that are mounted directly onto the printed circuit board 22 along the bottom surface 26. The printed circuit board 22 and substrate 20 may be formed from rigid printed circuit board materials such as fiberglass-filled epoxy.

The electrical components 28 may be sensitive to electromagnetic interference and may have the potential to generate electromagnetic interference for other components. At least one of the components 28 on the substrate 20 may need to be electromagnetically shielded from components that generate electromagnetic interference or from external sources of electromagnetic interference.

The substrate 20 has a conductive ground layer 30 is disposed adjacent the top surface 24. The ground layer 30 is ground plane that extends as a solid layer through the entire substrate. As shown in FIG. 2, the ground layer 30 extends as a continuous layer along the width and length of the substrate 20. Additional routing layers 32 may be disposed in the substrate 20 between the ground layer 30 and the bottom surface 26 and the printed circuit board 22. The substrate 20 may include any number of intermediate layers 32 such as the routing layers, dependent on the electronic device.

The ground layer 30 is electrically connected bottom surface 26 with a ground stitch via 34. The ground stitch via 34 electrically connects the ground layer 30 to conductive contact pads 36 disposed on the bottom surface 26. (FIG. 2 illustrates the substrate 20 oriented with the contact pads 36 and bottom surface 26 so they are visible.) The ground stitch via 34 may be formed as a conductive through-hole in the substrate 20, or may be formed at the edge of the substrate 20, as shown in FIG. 3. The ground stitch vias 34 are formed adjacent the perimeter of the substrate 20 and outboard of the printed circuit board 22 and any components 28.

The ground stitch vias 34 electrically connect the ground layer 30 to the bottom surface 26 and as such, the ground stitch vias 34 are only exposed on the bottom surface 26 of the substrate 20. The contact pads 36 to which the ground stitch vias 34 are connected may be bare metallic pads mounted on the bottom surface 26 and are arranged along the perimeter of the bottom surface 26. The contact pads 36 are positioned also outboard of the printed circuit board 22 and any components 28.

The bottom surface 26 of the substrate 20 mates to the chassis 14 along a mounting surface 40. The mounting surface 40 defines a mounting datum plane 42 along the perimeter of the chassis 14. A plurality of raised dimples 44 are formed along the mounting surface 40 and extend above the datum plane 42. When the substrate 20 is mated to the chassis 14, each dimple 44 contacts a contact pad 36. The raised dimples 44 extend above any mounting bosses for the fasteners 16.

The chassis 14 is formed of conductive material such as a metallic material. The chassis 14 may be formed of cast metal, or machined metal or any suitable process to define the chassis 14 as a single piece metallic component. The chassis 14 has a cavity defined by side walls 46 and a distal wall 48. When the dimples 44 on the metallic chassis 14 are aligned with the contact pads 36 around the perimeter of the substrate, an electromagnetic shield 50 is defined. The electromagnetic shield enclosure 50 is a Faraday cage that extends around and shields the substrate 20 between the ground layer 30 and the chassis 14. In particular, the electromagnetic shield 50 blocks specific electromagnetic interference from the bottom surface 26 of the substrate 20.

Together with the conductive chassis 14, the electromagnetic shield 50 is formed by the electrical contact along the contact pads 36, the ground stitch via 34, and the ground layer 30 to form the Faraday cage. As such, the electromagnetic interference protection of the shield 50 is built into to the substrate construction without the need for extra components, such as EMI gaskets or shielding pads. By eliminating shielding gaskets and pads, material and installation costs are reduced.

The electromagnetic shield 50 protects the electrical components 28 along the bottom surface 26 as well as the intermediate routing layers 32 from electromagnetic interference while permitting transmission of electromagnetic signals from a transmitting component 56 such as for an antenna, transmitter, receiver, or transceiver. The transmitting component 56 is not contained within the Faraday cage, and is not shielded. As such, the transmitting component 56 is disposed closer to the top surface 24 than the ground layer 30.

The electronic device package 10 also includes the cover 12 that mates to the top surface 24 of the substrate 20. The cover 12 permits transmission of the electromagnetic signals from the transmitting component 56. The cover 12 is non-conductive and may be formed of plastic or any suitable material suitably that protects the substrate 20 while allowing transmission of electromagnetic signals.

Figure 4:
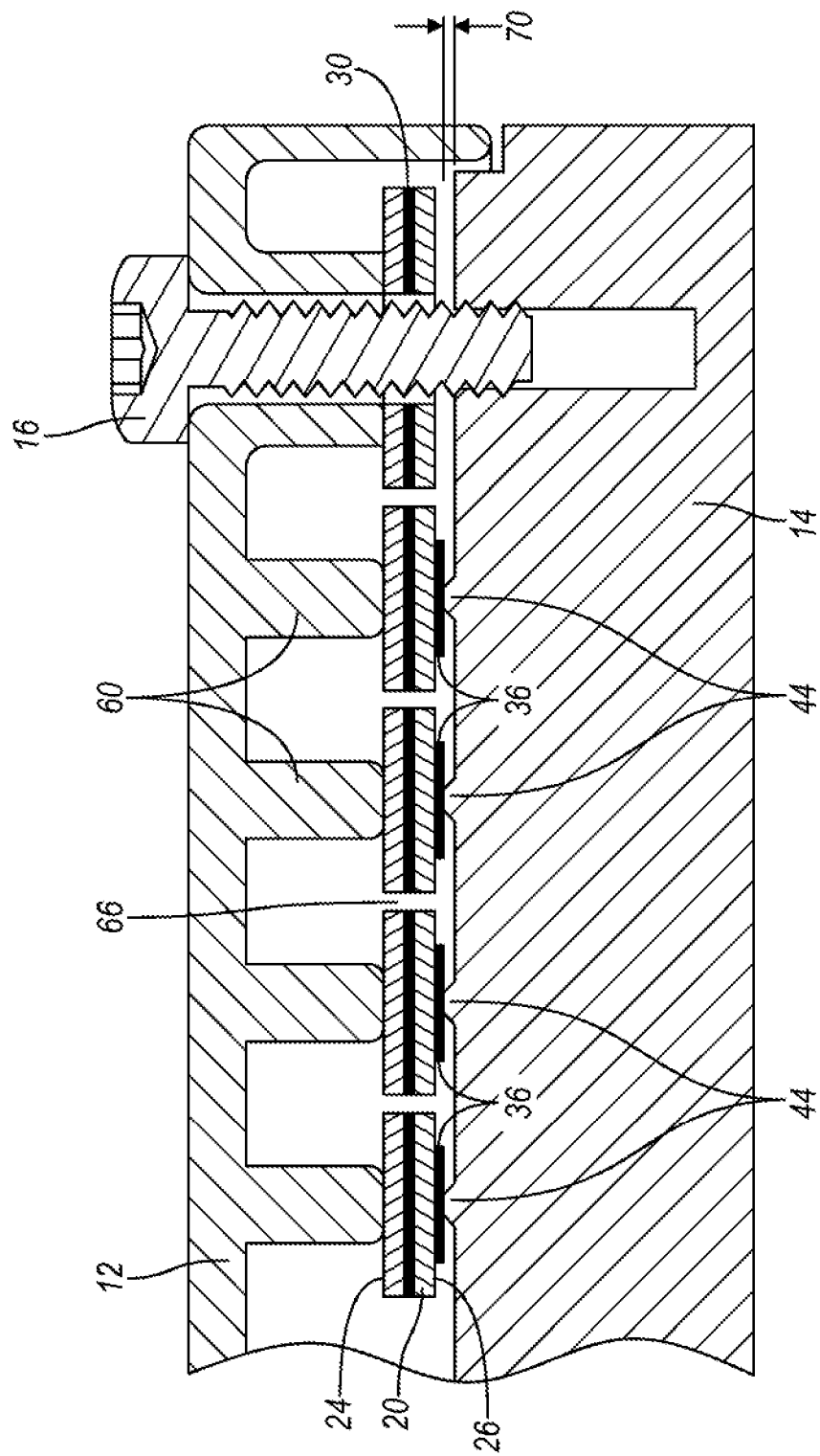
FIG. 4 illustrates a cross-section of the electronic device package of FIG. 1 taken along line 4-4.

The electronic device package 10 is assembled with the fasteners 16 that extend through the plastic cover 12 and substrate 20 into the chassis 14. The cover 12 includes a plurality of posts 60 that extend from an interior surface. When the cover 12 is assembled in the electronic device package 10, the posts 60 contact the top surface 24 of the substrate 20. The posts 60 may be aligned opposite the dimples 44 on the chassis 14, as shown in FIGS. 3-4. The posts 60 extend from an interior surface of the cover 12 along the perimeter of the cover 12. As illustrated, the posts 60 are formed as cylindrical protrusions, but any suitable shaped post may be used.

The datum plane 42, upon which the bottom surface 26 of the substrate 20 mates to the metallic chassis 14, is a specified distance below a datum plane of the ground layer 30. When the fasteners 16 are installed to secure the plastic cover 12 and the posts 60 contact the top surface 24 of the substrate 20, the cover 12 is placed into tension in the span between the pair of fasteners 16 on laterally opposite sides of the package 10. When the cover 12 is in tension, a force is applied to the substrate 20 by the cover 12 to ensure electric contact between each of the contact pads 36 and dimples 44.

The contact pads 36 may be spaced apart by relief cutouts 66 along the perimeter of the substrate 20. The relief cutouts 66, along with the cover 12 that is always in tension over the span of the substrate 20, apply a force to the substrate 20 at the contact pads 36. The contact pads 36 and relief cut outs 66 may be spaced apart by a distance that is defined as a ratio of the wavelengths sensitive harmonics, to the size of the aperture of electromagnetic radiation which is desired to be protected against. In one embodiment, the contact pads 36 and relief cutouts 66 may be spaced apart by a distance that is one-twentieth of the wavelength of electromagnetic radiation which is desired to be protected against. The distance between the contact pads 36 may be varied depending on the specific wavelength of electromagnetic interference that is of particular concern.

FIG. 4 illustrates a line-to-line condition between each of the ground contact pads 36 and the dimples 44 of the chassis 14, and between the top surface 24 of the substrate 20 and the cover 12. A gap 70 is defined between the substrate 20 and the screw mounting boss 72 on the chassis 14, and between the substrate 20 and the cover 12 at the fastener 16 locations. When the fasteners 16 are driven into the chassis 14, the substrate 20 will deflect locally to reduce the gap outboard of the fasteners 16. When the substrate 20 deflects while the posts 60 are in contact with the top surface 24, the plastic cover 12 will be put into tension, thus guaranteeing electrical contact at every ground contact pad 36, even during environmental stressors.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic device comprising:
   a substrate having a ground layer disposed between opposing top and bottom surfaces, wherein a plurality of conductive contacts is disposed on the bottom surface of the substrate and are electrically connected to the ground layer by a ground stitch via, wherein the substrate includes a plurality of relief cutouts along a perimeter, wherein each conductive contact is spaced apart by one of the relief cutouts;
   an electrically conductive chassis having a mounting surface mounted to the conductive contacts along the bottom surface,
   wherein an electromagnetic shield comprises the ground layer, the ground stitch via, the conductive contacts and the chassis to enclose the bottom surface of the substrate and protect the bottom surface from electromagnetic interference; and
   a non-conductive cover assembled to the substrate in tension so that an interior surface of the cover applies a force to the top surface of the substrate thereby ensuring the chassis maintains in electrical contact with the ground layer.

2. The electronic device of claim 1 wherein the ground layer is disposed at a predetermined distance from a surface of the chassis.

3. The electronic device of claim 2 wherein the ground layer is disposed in a layer of the substrate adjacent the top surface.

4. The electronic device of claim 3 wherein the interior surface of the cover includes a plurality of posts arranged along a perimeter, wherein the posts contact the top surface of the substrate.

5. The electronic device of claim 1 wherein the electromagnetic shield defines a Faraday cage for preventing electromagnetic interferences, wherein the electromagnetic shield does not include any additional components to form the Faraday cage.

6. The electronic device of claim 5 wherein the cover permits transmission of electromagnetic signals from an electrical component disposed in the substrate outboard of the ground layer.

7. The electronic device of claim 1 wherein the conductive contacts are spaced apart by a maximum distance based on an electromagnetic wavelength.

8. The electronic device of claim 1 wherein the chassis has a plurality of raised dimples spaced apart along the mounting surface of the chassis, each raised dimple contacting one of the electrical conductive contacts on the substrate and maintaining a gap between the substrate and the chassis in a region between each of the dimples.

9. The electronic device of claim 8 further comprising a pair of fasteners extending through the cover and substrate into the chassis, wherein each of the pair of fasteners are disposed at opposing lateral sides of the substrate and define a span therebetween, wherein the cover contacts the top surface of the substrate to produce a downward force and maintain the cover in tension along the span between the pair of fasteners.

10. The electronic device of claim 9 wherein the plurality of raised dimples and conductive contacts are disposed within the span between the pair of fasteners, wherein the cover maintains the substrate in tension and ensures contact between each of the conductive contacts and raised dimples.

11. An electronic device comprising:
a substrate having opposing top and bottom surfaces;
a ground layer disposed in the substrate, the substrate having a plurality of conductive contacts disposed on the bottom surface of the substrate and spaced apart by a distance;
an electrically conductive chassis having a mounting surface contacting the bottom surface of the substrate and in electrical contact with the ground layer by a ground stitch via on the substrate, the chassis having a plurality of raised dimples spaced apart along the mounting surface of the chassis, wherein each raised dimple contacts one of the conductive contacts on the substrate and maintains a gap between the substrate and the chassis in a region between each of the dimples;
an electromagnetic shield comprising the ground layer, the ground stitch via and the chassis to enclose the bottom surface of the substrate and protect the bottom surface from electromagnetic interference;
a non-conductive cover having a plurality of posts extending from an interior surface of the cover; and
a pair of fasteners extending through the cover and substrate into the chassis, wherein each of the pair of fasteners are disposed at opposing lateral sides of the substrate and define a span therebetween,
wherein the cover is adapted to be assembled to the substrate so the plurality of posts contacts the top surface of the substrate to produce a downward force and maintain the cover in tension along the span between the pair of fasteners.

12. The electronic device of claim 11 wherein the substrate includes a plurality of relief cutouts along a perimeter, wherein each conductive contact is spaced apart by one of the relief cutouts.

13. The electronic device of claim 11 wherein the conductive contacts and dimples are spaced apart by a maximum distance based on an electromagnetic wavelength of a specific electromagnetic interference.

14. The electronic device of claim 11 wherein at least one first electrical component is mounted on the bottom surface of the substrate;
a second electrical component disposed in the substrate adjacent the top surface;
wherein the ground layer is disposed in the substrate between the second electric component and the bottom surface.

15. The electronic device of claim 14 wherein the second electrical component is an antenna.

16. The electronic device of claim 11 wherein the chassis is formed as a single metallic component.

17. An electronic device comprising:
a substrate having a ground layer disposed between opposing top and bottom surfaces, wherein a plurality of conductive contacts is disposed on the bottom surface of the substrate and are electrically connected to the ground layer by a ground stitch via;
an electrically conductive chassis having a mounting surface mounted to the conductive contacts along the bottom surface, wherein the chassis has a plurality of raised dimples spaced apart along the mounting surface of the chassis, each raised dimple contacting one of the conductive contacts on the substrate and maintaining a gap between the substrate and the chassis in a region between each of the dimples,
wherein an electromagnetic shield comprises the ground layer, the ground stitch via, the conductive contacts and the chassis to enclose the bottom surface of the substrate and protect the bottom surface from electromagnetic interference; and
a non-conductive cover assembled to the substrate in tension so that an interior surface of the cover applies a force to the top surface of the substrate thereby ensuring the chassis maintains in electrical contact with the ground layer.

18. The electronic device of claim 17 further comprising a pair of fasteners extending through the cover and substrate into the chassis, wherein each of the pair of fasteners are disposed at opposing lateral sides of the substrate and define a span therebetween, wherein the cover contacts the top surface of the substrate to produce a downward force and maintain the cover in tension along the span between the pair of fasteners.

19. The electronic device of claim 18 wherein the plurality of raised dimples and conductive contacts are disposed within the span between the pair of fasteners, wherein the cover maintains the substrate in tension and ensures contact between each of the conductive contacts and raised dimples.

* * * * *